United States Patent
Wong

Patent Number: 6,113,216
Date of Patent: Sep. 5, 2000

[54] WIDE ARRAY THERMAL INK-JET PRINT HEAD

[75] Inventor: Marvin G. Wong, Corvallis, Oreg.

[73] Assignee: Hewlett-Packard Company, Palo Alto, Calif.

[21] Appl. No.: 08/694,964

[22] Filed: Aug. 9, 1996

[51] Int. Cl.[7] ........................................ B41J 2/01
[52] U.S. Cl. ............................................ 347/50
[58] Field of Search ................... 347/50, 57–59; 174/263; 29/840; 435/66

[56] References Cited

U.S. PATENT DOCUMENTS

| | | | |
|---|---|---|---|
| 4,550,612 | 11/1985 | Yamada et al. | 73/727 |
| 4,680,859 | 7/1987 | Johnson . | |
| 4,695,853 | 9/1987 | Hackleman et al. . | |
| 4,862,197 | 8/1989 | Stoffel . | |
| 5,016,023 | 5/1991 | Chan et al. . | |
| 5,133,495 | 7/1992 | Angulas et al. | 228/180.1 |
| 5,203,075 | 4/1993 | Angulas et al. . | |
| 5,279,711 | 1/1994 | Frankeny et al. | 174/263 |
| 5,369,880 | 12/1994 | Gundotra et al. . | |
| 5,439,956 | 8/1995 | Noguchi | 347/20 |
| 5,442,384 | 8/1995 | Schantz et al. | 347/50 |
| 5,453,581 | 9/1995 | Liebman et al. . | |
| 5,539,153 | 7/1996 | Schwiebert et al. | 228/180.1 |
| 5,777,576 | 7/1998 | Zur et al. | 347/120 |

*Primary Examiner*—John Barlow
*Assistant Examiner*—Michael S Brooke

[57] ABSTRACT

The print head includes a substrate having a driver chip attached to a portion of the substrate and a layer of a row of resistors attached to another portion of the substrate. The chip is connected to a plurality of interconnect pads, which are positioned substantially in rows. The driver chip is connected to the resistors individually by circuit traces. The circuit traces are deposited on the substrate in a circuit trace layer. The interconnect pads in a row are spaced a larger distance apart than the resistors. The driver chip is attached to the substrate by a soldering and polymer bonding technique. The technique includes depositing a bondable film layer over the surface of the substrate and interconnect pads, creating openings around the interconnect pads, thereby exposing the pads, and forming a solder ball on each pad. The driver chip is provided with solderable pads, which are positioned near the solder balls. The solder balls and solderable pads are heated to metallically join the chip and interconnect pads, and the film layer is bonded to the chip.

13 Claims, 6 Drawing Sheets

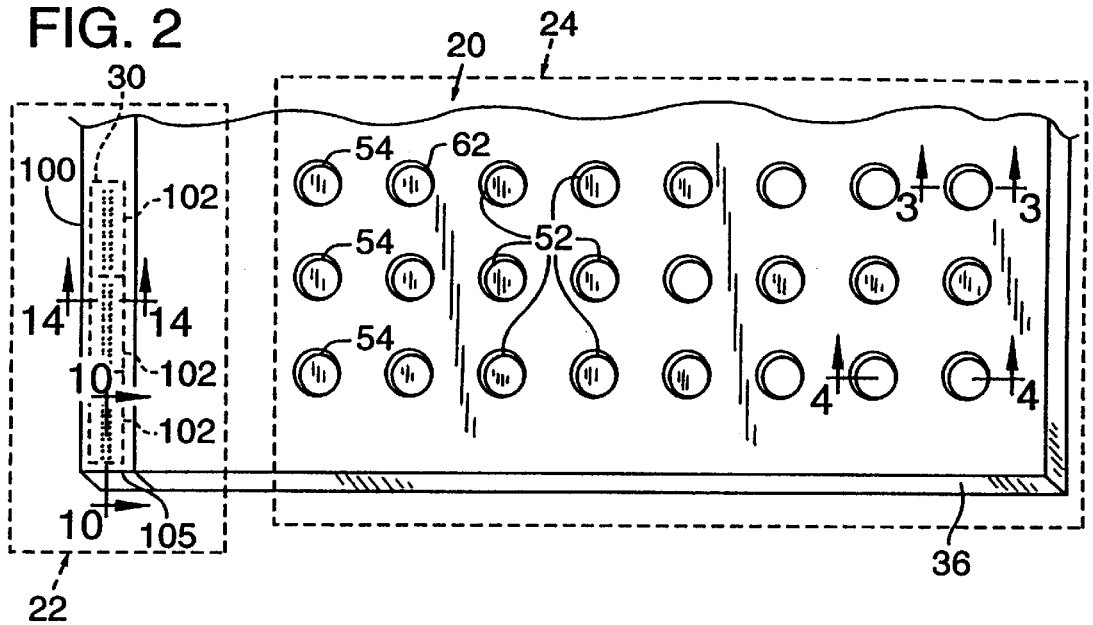
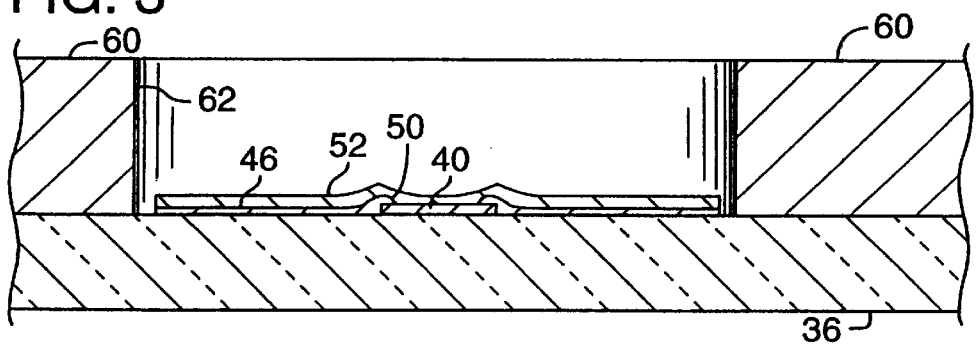
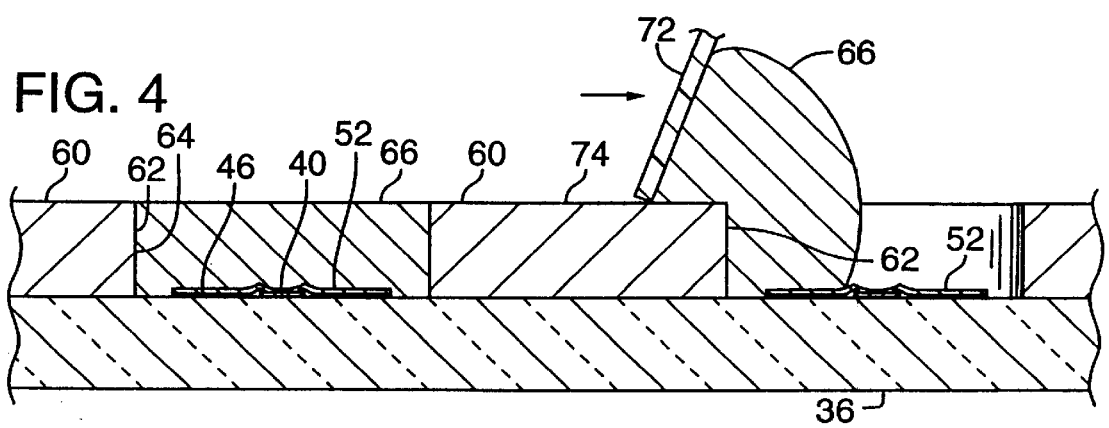

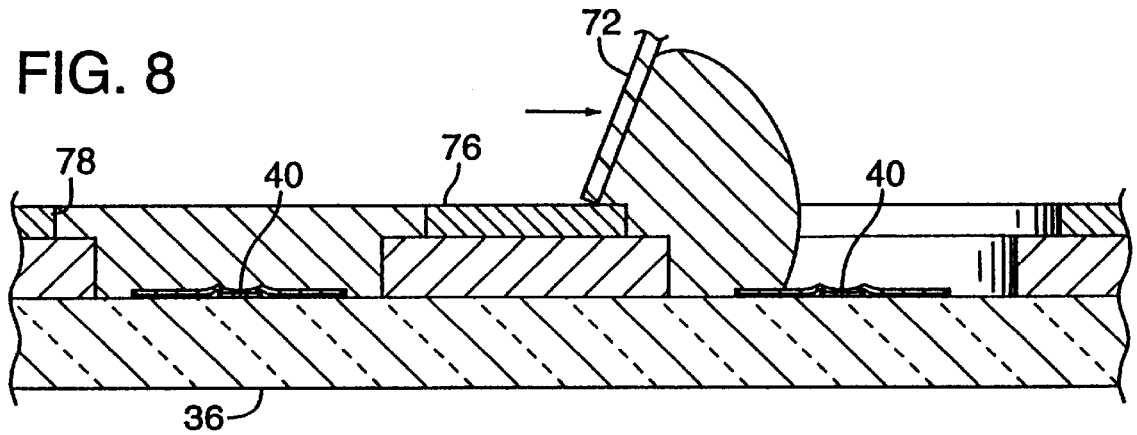
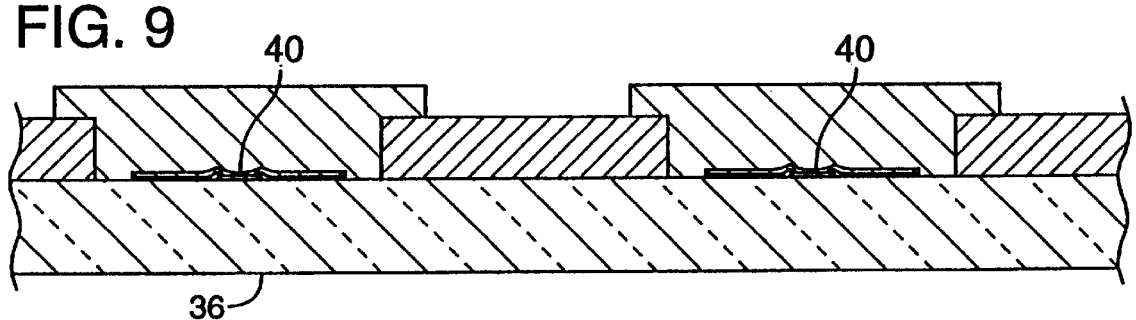
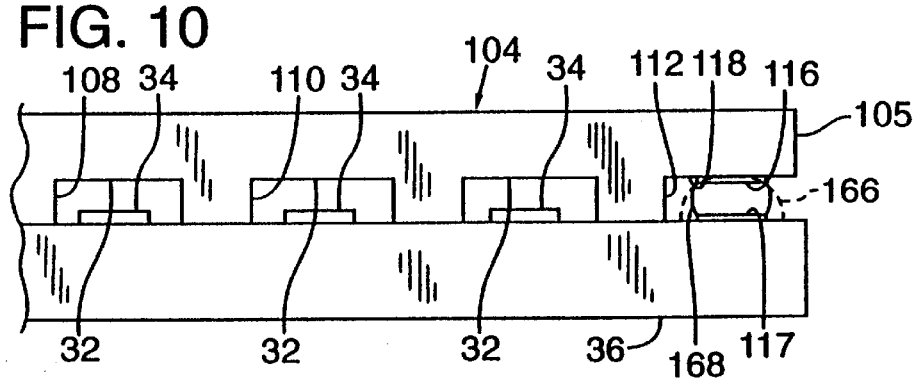

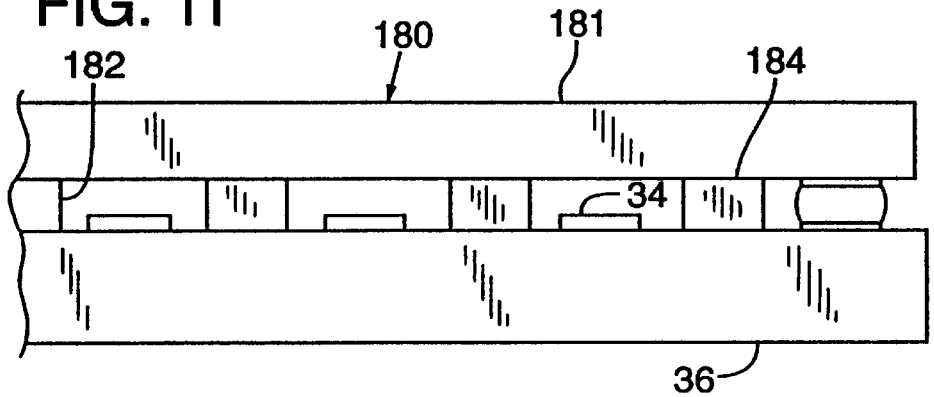
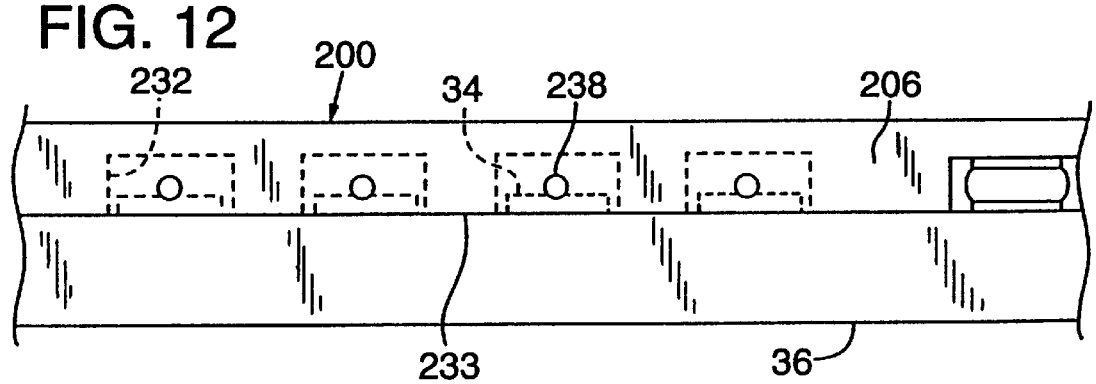
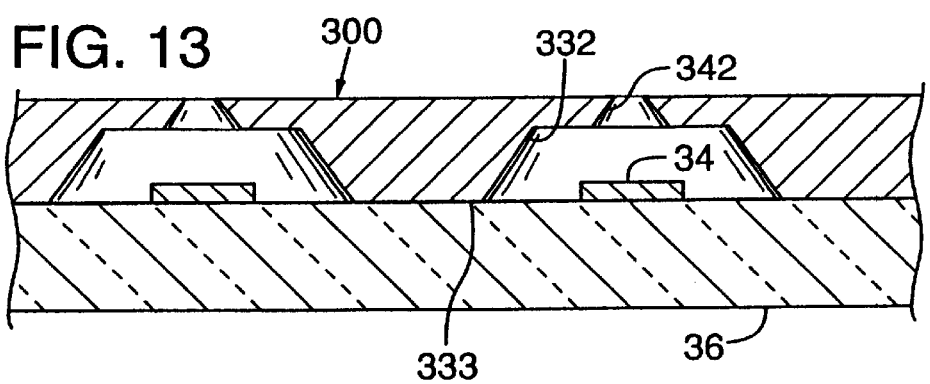

WIDE ARRAY THERMAL INK-JET PRINT HEAD

TECHNICAL FIELD

This invention relates to a wide array thermal ink-jet print head for a printer.

BACKGROUND AND SUMMARY OF THE INVENTION

Thermal ink-jet printers have become widely popular as inexpensive printing devices. An essential feature of a thermal ink-jet printer is a print head that is controlled to selectively eject tiny droplets of ink onto a printing surface, such as a piece of paper, to form desired images and characters.

The print head generally has an architecture plate with multiple tiny nozzles through which ink droplets are ejected. Adjacent to the nozzles are ink chambers, where ink is stored prior to ejection through the nozzles. Ink is delivered to the ink chambers through ink channels that are in fluid communication with an ink supply.

The print head usually is formed of a sandwich construction, having a substrate at its base. Attached to the substrate is a layer of circuit traces and a layer of the resistors. The resistors are overlaid with a protective, passivation layer. The architecture plate is bonded to the substrate and substantially covers the other layers.

The resistors are lined up beneath the chambers in the architecture plate. Electrical signal inputs to the resistors "fire" the resistors, heating the resistors and thereby a volume of ink within the adjacent ink chamber. The heating generates a vapor bubble in the ink to force an ink droplet out of the nozzle.

Usually, remote bus lines provide signal inputs from an external signal source to the resistors on the print head. Oftentimes, the signals are delivered through multiplexed circuitry on the substrate. The print head is generally connected to these bus lines by a thin flat electrical cable, such as a tape automated bond ("TAB") circuit. A TAB circuit generally has copper leads supported on a copper-coated tape. The tape is usually bonded onto the print heads with gold bump contacts. Conventional TAB circuit bonding cannot be done over live silicon circuitry without damaging the circuitry and requires use of an encapsulant to protect the leads from the ink, which adds a process step and decreases the robustness of the bond. Nevertheless, TAB circuit bonding is generally used because it is space-efficient, allowing the contact to be made in a tiny area.

In most ink-jet printers, the print head is mounted on an ink pen that is mounted to a carriage that traverses the printing surface to move the print head back and forth over the printing surface. Thus, the print head can be made relatively small in comparison to the width of the printing surface because the ink pen traverses the width of the printing surface. However, it takes the carriage a certain amount of time to traverse the paper, which slows down the speed of printing.

One way to increase the printing speed is to increase the number of nozzles on the print head, which necessitates an increase in the size of the print head. However, increasing the size of the print head requires a larger architecture plate, and a large architecture plate increases the likelihood of failure of the bonding of the interface between the architecture plate and the substrate. One reason for such failure is that the materials for the substrate and the architecture plate usually have considerably different coefficients of thermal expansion. Thus, the sandwich construction may bow or delaminate after assembly as the print head is heated and cooled during operation.

Sometimes, components within ink-jet printers are attached together by flip-chip processing. Flip-chip processing is the term used to describe the method of attaching two parts, such as a die and a substrate, by providing both parts with solderable pads, depositing a solder ball on the solderable pad on the substrate, then placing the solderable pad of the die on top of the solder ball, and heating and pressing the die and substrate to form a solder joint. Often, the solder ball is formed by depositing solder paste on the solderable pad on the substrate and heating the paste and pad to reflow the solder paste into a solder ball.

Oftentimes, after the two parts are attached by flip chip processing, an underfill made of liquid epoxy will be shot between the parts and allowed to wick therebetween, in a process separate from flip-chip processing. The underfill layer comprising the cured epoxy fills gaps between the parts and relieves some of the stress on the solder joint.

This invention provides a direct drive, page-wide array thermal ink-jet print head. Page wide array printheads have been disclosed in U.S. patent application Ser. No. 08/551,266, filed on behalf of Paul H. McClelland et al. on Oct. 31, 1995, titled "Large Area InkJet Printhead" and U.S. patent application Ser. No. 08/550,698, filed on behalf of Paul H. McClelland et al. on Oct. 31, 1995, titled "Printhead With Puny Driven Ink Circulation". These applications are assigned to the assignee of the present invention. The print head of the present invention allows an entire line of characters to be printed nearly simultaneously, which increases printing speed. The embodiment of the present invention is produced using a substantially modified version of an assembly process known as "flip chip" processing.

A preferred embodiment of the invention includes a substrate having a circuit trace layer deposited thereon. The substrate also carries a layer comprising a row of resistors attached to a portion of the circuit trace layer and to the substrate. A driver chip is attached over another portion of the circuit trace layer. The driver chip receives signals from the central processing unit and sends signals to the resistors. The circuit trace layer includes circuit traces that connect the driver chip to the resistors for sending signals to "fire" the resistors.

As another aspect of this invention, the driver chip is attached to the substrate using a soldering and polymeric bonding technique. For this technique, multiple interconnect pads are deposited over the circuit trace layer on the substrate. The interconnect pads are positioned in rows and are spaced further apart than are the resistors. A polymeric underfill layer is deposited over the substrate and interconnect pads. Because the underfill layer is deposited before the soldering is complete, the layer is referred to as a pre-placed underfill layer. An opening is created at each interconnect pad to expose the interconnect pad and form a cavity that surrounds the pad. Solder paste is deposited in each opening and then is reflowed to create a solder ball on each interconnect pad. The chip is provided with multiple solderable pads that are spaced to align with the interconnect pads. Each solderable pad is positioned near a solder ball. Heat and pressure are applied to the solder balls, interconnect pads, and solderable pads to melt the solder to form a solder joint and to polymerically bond the chip to the substrate.

This soldering and bonding technique can be used instead of TAB circuit bonding because the relatively increased spacing between the interconnect pads (compared to the resistor spacing) provided by the present invention affords more room in which to make an electrical interconnect. This technique is quicker than applying an underfill after soldering and expected to be more robust than conventional TAB bonding in thermal ink-jet applications.

As yet another aspect of this invention, the opening in the underfill layer at each interconnect pad is sized to contain an amount of solder paste that, when reflowed, will form an appropriate size solder ball for attaching the chip thereon. Thus, the underfill layer also acts as an in-situ stencil for measuring the correct amount of solder paste, thereby eliminating the need for a separate measuring step.

Using a pre-placed underfill reduces the number of process steps required to produce an assembly because the underfill does not need to be applied separately. Another advantage is that it controls the collapse of the solder balls during melting so that the balls do not unduly spread out due to the weight of the chip or the pressure that may be applied to the chip. The underfill between the substrate and chip also serves to adhere the two parts together and to relieve stress on the solder joint between the two parts. Yet another advantage is that the underfill layer has a very short bonding time, especially in comparison to the cure time required of liquid epoxy.

BRIEF DESCRIPTION OF THE DRAWINGS

FIG. 2 is a partial top view of the print head of the present invention, with the driver chip removed.

FIG. 3 is a sectional view of an interconnect area of the present invention, taken along line 3—3 of FIG. 2.

FIG. 4 is a sectional view taken along line 4—4 of FIG. 2 of the present invention, showing the process of applying solder paste.

FIG. 8 is a sectional view, like FIG. 4, but showing the use of a removable stencil.

FIG. 9 is a sectional view, like FIG. 8, but with the stencil removed.

FIG. 10 is a partial side view of an ink ejection area of the print head of FIG. 2.

FIG. 11 is a partial side view, like FIG. 10, but of an alternative embodiment of the present invention in which an underfill layer defines ink chambers.

FIG. 12 is a partial side view, like FIG. 10, but of an alternative embodiment of the present invention having an edge-firing architecture plate.

FIG. 13 is a partial sectional view, similar to FIG. 10, but taken through an alternative embodiment of the present invention having a face-firing architecture plate.

DETAILED DESCRIPTION OF THE INVENTION

Figure 1:
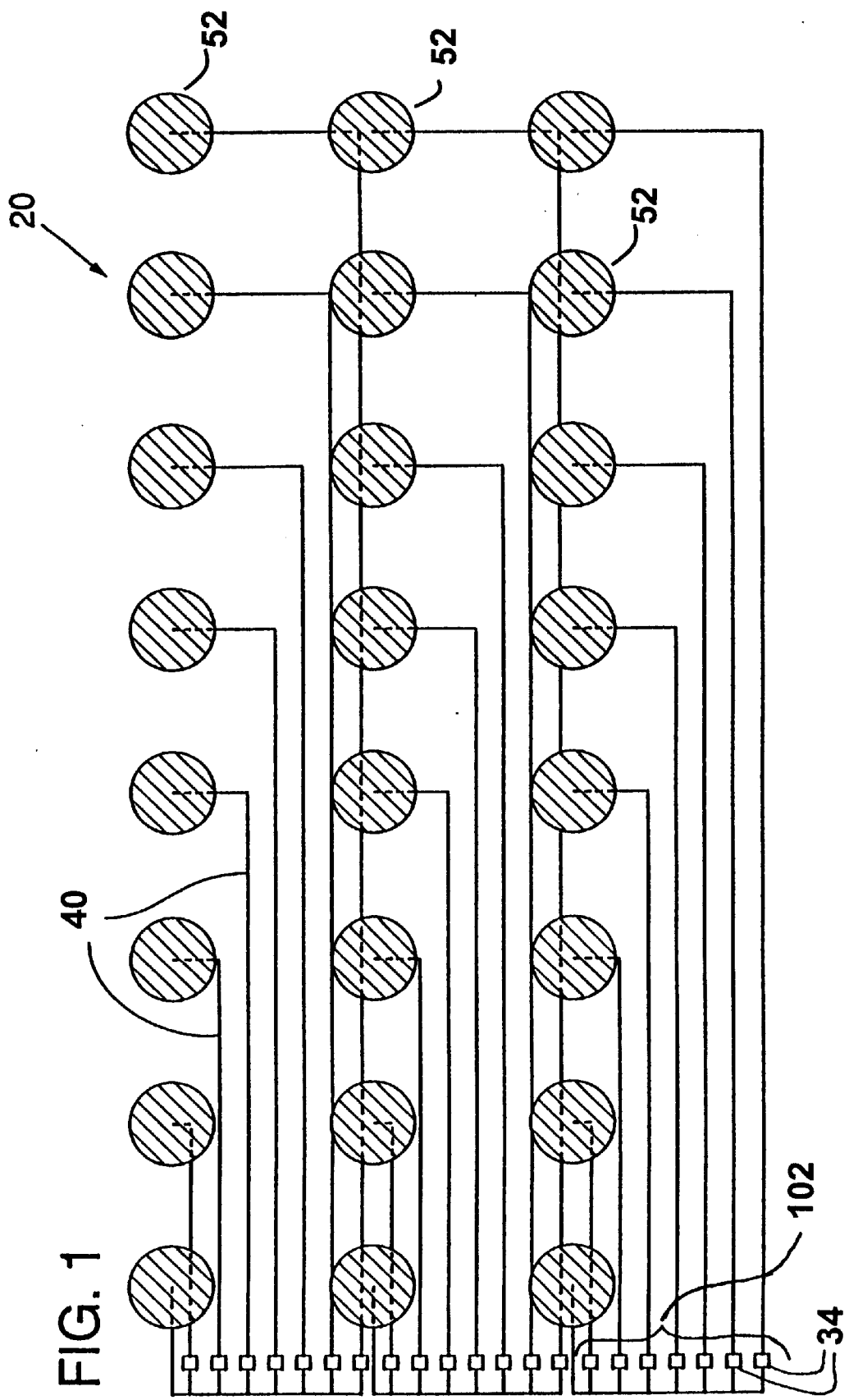
FIG. 1 is a partial top schematic view of the print head of the present invention.

A print head 20 in accordance with the present invention is illustrated in FIG. 1. The print head 20 is mounted on a printer (not shown) and selectively ejects ink droplets onto a printing surface (not shown), such as a piece of paper, which is advanced through the printer.

As shown in FIGS. 1 and 2, the print head 20 of the present invention has two main areas: an ink-ejection area 22, from which ink is ejected, or "fired", onto paper adjacent the ink-ejection area 22, and an interconnect area 24 that includes a driver chip 26, or multiple driver chips, for sending signals to the ink-ejection area 22 to eject the ink from the ink-ejection area 22, as will be described in more detail below.

The ink-ejection area 22 has an architecture plate 30 having chambers 32 for containing small amounts of ink, as best shown in FIG. 10. Beneath the chambers 32 are resistors 34 that are heated upon receiving a signal from the driver chip 26. The heat from the resistor heats the ink in the adjacent chamber 32, which expands the ink, forcing the ink from the chamber 32 onto the paper.

Both the ink-ejection area 22 and the interconnect area 24 are fabricated on a common substrate 36, as shown in FIG. 2. The illustrated substrate 36 is an elongate, rectangular block of amorphous silicon with a thickness of 25–50 micrometers (about 1–2 mils). Silicon is particularly well-suited because it is flexible out of the plane and yet is very stiff in the plane, as well as being chemically unreactive at temperatures near room temperature. The stiffness in the plane allows good registration with the architecture plate 30, which is particularly important when the substrate 36 and plate 30 are several inches long. Nevertheless, the substrate 36 could be made of other materials, such as glass, ceramic, or a metal substrate with a ceramic coating.

As partially indicated in FIG. 3, a circuit trace layer, comprising a plurality of discrete, conductive circuit traces 40, extends across substrate 36. The circuit traces 40 connect the ink ejection area 22 with the interconnect area 24 to deliver signals from the driver chip 26 to the resistors 34, as described in more detail below. The circuit traces 40 are deposited on the substrate 36 by sputtering or, alternatively, by evaporation. The traces 40 preferably are made of tantalum-aluminum/aluminum, approximately 0.6 micrometers thick.

A passivation layer 46, shown in FIG. 3, is deposited over the traces 40. The passivation layer 46 preferably is made of nitride/carbide and is 0.25 micrometers (approximately 0.01 mils) thick.

In the interconnect area 24, vias 50 are created through the passivation layer 46, such as by etching, to expose portions of the circuit traces 40 to provide an electrical path between the traces 40 and interconnect pads 52 that are sputtered onto the vias 50 and passivation layer 46. The interconnect pads 52 are deposited by sputter-coating, electroless plating, or a comparable process. The interconnect pads 52 should be solderable. In other words, the interconnect pads 52 should be able to be wetted by solder. The interconnect pads 52 preferably are made of nickel-vanadium/gold and in the illustrated embodiment are disk-shaped with a diameter of 125 micrometers (approximately 5 mils) and a thickness of approximately 1500 angstroms.

As shown in FIG. 2, the interconnect pads 52 are arranged in parallel rows, extending longitudinally along the portion of the substrate 36 shown. Each interconnect pad 52 is connected to a single resistor 34, except a ground interconnect pad 54 in each row is reserved for ground, as shown in FIG. 3. Preferably, the pad 54 closest to the resistors 34 is the pad for the common line of a set of resistors 34 as illustrated in FIG. 2, so as to decrease the line resistance for the line that will carry the most current between the chip 26 and the resistor 34. The illustrated embodiment shows a print head 20 with a resolution of 600 dots per inch having eight interconnect pads 52 per row on a 250 micrometer pitch, meaning that the centers of the illustrated pads are spaced apart 250 micrometers.

The driver chip 26, which sends firing signals to the resistors, is attached to the interconnect pads 52 by a combination soldering and polymer bonding technique of the present invention. The technique involves spinning on a thin underfill layer 60, of approximately 25–125 micrometers (about 1–5 mils) thick, over the circuit traces and interconnect pads 52 (FIG. 3). The underfill layer 60 could also be deposited by thick-film lamination. Preferably the underfill layer 60 is made of a photoimageable polyimide.

Openings 62, preferably circular, are created in the underfill layer 60 to expose the pads 52 and to define a cavity 64 around each pad, as shown in FIG. 3. The openings 62 could be created by patterning the layer by photoimaging and developing or by chemical etching. The openings 62 could also be created by laser drilling, for example.

Figure 5:
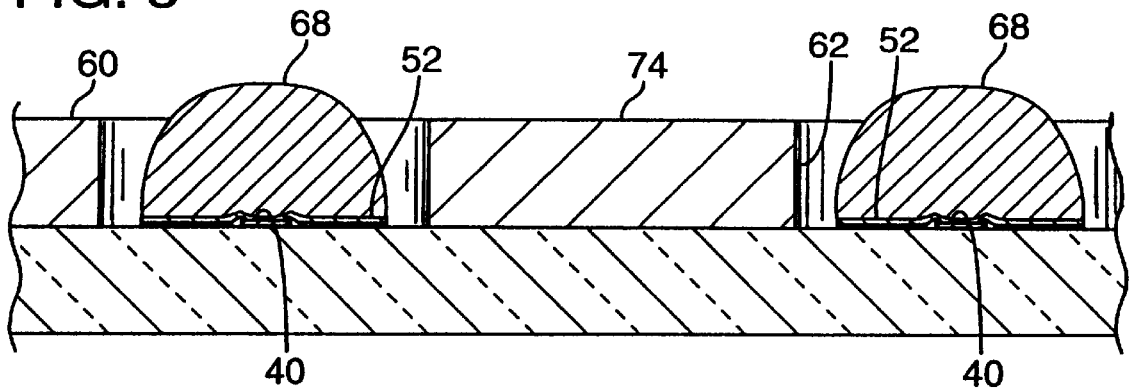
FIG. 5 is a sectional view, like FIG. 4, after reflowing the solder paste and removing any flux residues.

Solder paste 66 is deposited in the cavities 64, as shown in FIG. 4. The solder paste 66 is reflowed to form a dome-shaped solder ball 68 on top of each interconnect pad 52, as illustrated in FIG. 5. The solder paste 66 is approximately 50% solder alloy (containing, for example, tin, lead, bismuth, silver, or indium) and 50% flux by volume.

Preferably, the cavity 64 volume is appropriate for the amount of solder paste 66 necessary to create a solder ball 68 of a sufficient size to attach to a solder pad on one of the driver chips 26 as explained below. In this way, the underfill layer 60, which defines the cavity volume, acts as an in situ stencil to measure and contain the solder paste 66, allowing the appropriate amounts of solder paste 66 to be applied quickly. Preferably, the solder paste 66 is applied in and around the openings 62, and a squeegee 72 is pushed across the surface 74 of the underfill layer 60 to force the paste 66 into the cavities 64, to remove any excess solder paste 66 from the surface 74 of the underfill layer 60, and to level off the solder paste 66 in the cavities 64, as indicated in FIG. 4.

If a volume of solder paste 66 larger than the volume of the cavity 64 in the underfill layer 60 is needed, a removable, auxiliary stencil 76 could be placed on top of the underfill layer 60 to create second layer openings 78 to enlarge the volume of the cavity (FIG. 8). Solder paste 66 could be deposited while the stencil 76 is in place. The stencil could then be removed before or after the solder ball is formed. The former is indicated in FIG. 9.

To reflow the solder paste 66, the paste 66 is heated, preferably to 220 degrees celsius in an inert environment, such as nitrogen. Other inert environments, such as argon and helium, could also be used. The flux residues may be removed, such as by washing away, before assembling the driver chip 26 on the substrate 36 to provide better adhesion of the underfill layer 60 to the driver chip 26. Eliminating the flux residues is beneficial because the flux residues promote corrosion in high-humidity environments.

A volatile flux could be applied to the solder ball 68 or the interconnect pad 52 on the substrate 36 to promote solder wetting to the interconnect pad 52 on the substrate 36. The flux is useful when the surface of the solder ball 68 is too oxidized to permit fluxless soldering.

Alternatively, if flux is not used, the surface oxide film that will probably form on the surface of the solder ball 68 could be cracked, as will be described in greater detail below.

Figure 6:
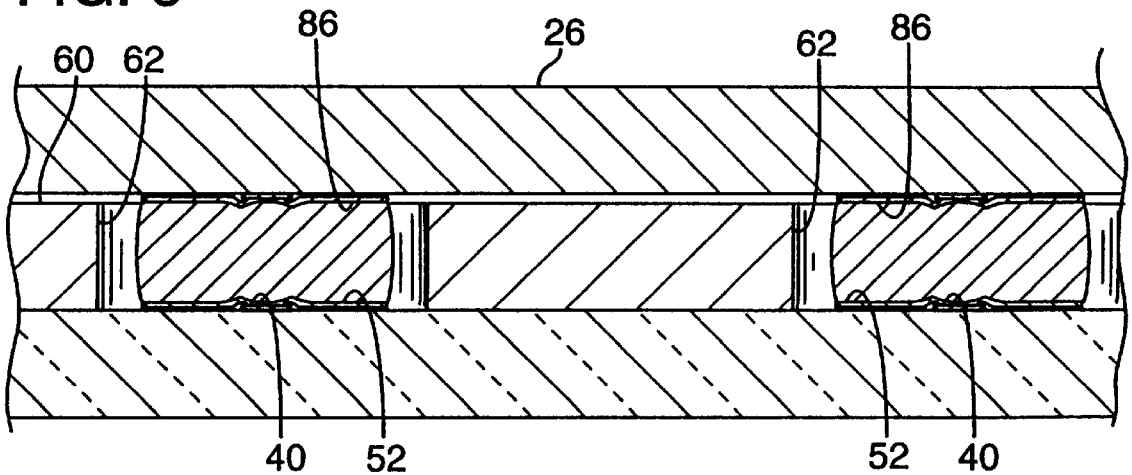
FIG. 6 is a sectional view, like FIG. 4, but including the driver chip.

The driver chip 26 is provided with solderable pads 86 (FIG. 6), similar to the interconnect pads 52 on the substrate 36. The pads 86 are spaced to correspond with the spacing of the interconnect pads 52. The driver chip 26 is placed on the solder balls 68 with the solderable pads 86 contacting the tops of the solder balls 68.

If flux is not used, the surface oxide film on the solder ball 68 may be cracked by pressing the solderable pads 86 on the driver chip 26 against the solder ball 68, which will allow the liquid solder to wet the solderable pads 86.

Figure 7:
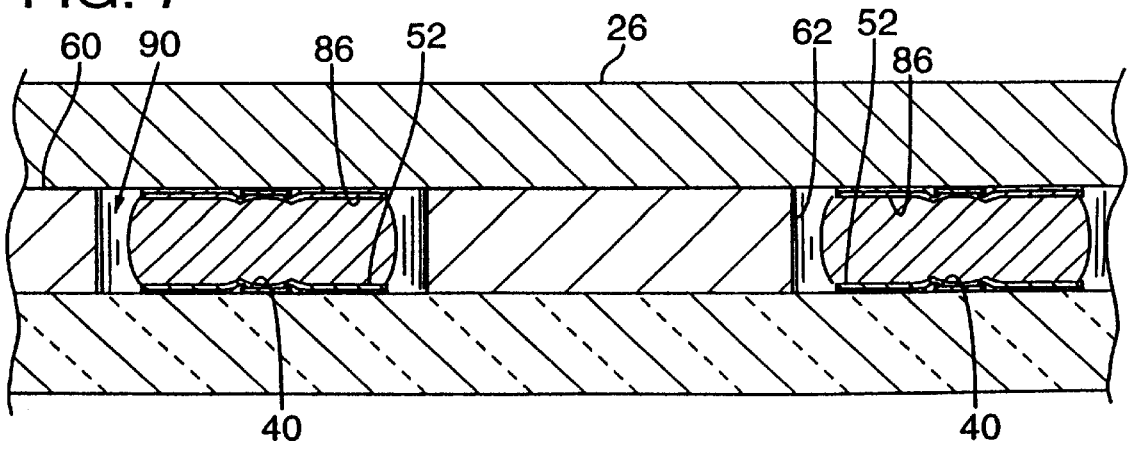
FIG. 7 is a sectional view, like FIG. 4, showing the driver chip bonded to the interconnect area at the print head.

The assembly of the interconnect pads 52, the solder balls 68, and the driver hip 26 with the solderable pads 86 is heated to melt the solder and is pressed together. The heat and pressure collapse the solder balls 68 and bond the underfill layer 60 to the driver chip 26, as shown in FIG. 7. Heating to a temperature of 220 degrees celsius in nitrogen is effective to melt the solder.

Preferably, the pressure is applied to the assembly in a manner that permits some minute, lateral shifting of the driver chip relative to the substrate so that the surface tension forces on the liquid solder balls 68 and solderable pads 86 tend to pull the driver chip 26 into lateral alignment with the substrate 36. Alternatively, the parts 26, 36 could be manually aligned.

After the chip 26 is pressed with heat to collapse the solder balls 68, solder joints 90 (FIG. 7) or metallic connections between the driver chip 26 and the substrate 36 are formed, and the underfill layer 60 is polymerically bonded to the driver chip 26, forming a sandwich construction.

Alternatively, the underfill layer 60 could be bonded after the solder joints 90 are formed. In such a case, the underfill layer 60 would be heated again after the solder joints 90 are formed, and the driver chip 26 would be pressed against the underfill layer 60 to effect the bonding.

The process of the present invention provides a fairly inexpensive way to electrically connect parts, and the configuration of this invention, in particular the rows of interconnect pads 52 extending perpendicularly from the row of resistors 34, allows the interconnect pads 52 to be spaced apart further than past configurations, which allows this inexpensive connection method to be used.

The process of the present invention could also be used to attach various other microelectronic parts together, such as flexible circuits or wafers of integrated circuits.

The underfill layer 60 functions both as an in situ stencil and as a pre-placed underfill, which supports the driver chip on the substrate to relieve stress from the solder joint between the interconnect pad and the driver chip to thereby increase the fatigue life of the solder joint. A pre-placed underfill expedites the attachment of the driver chip 26 to the interconnect pads 52 by reducing the number of fabrication steps required and because the underfill layer 60 does not require a long curing time, as does liquid epoxy. The underfill layer 60 is also advantageous because it obstructs moisture and chemicals from entering between the parts, which inhibits corrosion.

Although this description discussed applying the underfill layer to and forming solder balls 68 on the substrate 36, the underfill layer 60 and solder balls 68 could be deposited on the driver chip 26 instead.

The ink-ejection area 22 on the substrate 36 has a layer of resistors 34 extending across the top of the substrate 36, near a side 100 of the substrate 36, as shown in FIG. 2. The resistors 34 are made from tantalum aluminum, having a thickness of about 950 angstroms, and are sputtered on top of the substrate 36, as is common in ink-jet technology. As best seen in FIG. 1, the resistors 34 are electrically connected to the driver chip 26 by the circuit traces 40. The illustrated resistors 34 are square and are sized between about 3 microns by 3 microns and 75 microns by 75 microns, although other shapes and sizes could be used.

The resistors 34 are grouped in sets 102 of, for example, seven resistors, with each set corresponding to a row of interconnect pads 52. Each row of interconnect pads 52 extends generally perpendicularly from each set of resistors 102. The illustrated print head 20 has a resolution of 600 dots per inch and has approximately 680 sets of seven resistors each, spaced so that the overall length of the resistor sets is sufficient to cover the printing area on a standard piece of paper. The 680 sets of resistors are driven by the driver chip 26, or possibly multiple driver chips, through 680 rows of eight interconnect pads 52. It is envisioned that the resistors 34 could extend to sixty inches to accommodate larger widths of paper.

A cavitation barrier (not shown), preferably of nitride and carbide, and a passivation layer (not shown), preferably of tantalum, is deposited over the resistors. Such barriers are commonly used in ink-jet technology to shield the resistors 34 from the ink in the chambers 32, which is highly corrosive, and from cavitation erosion. Other types of barriers could also be used.

FIG. 10 shows an edge-firing architecture plate 104 positioned over the resistors 34 so that each resistor 34 is centered within one of the chambers 32 in the architecture plate 104. The edge-firing architecture plate 104 is an elongate, flat, solid, rectangular piece and has small cut-outs 108 in the longitudinal edge 106 of the plate 104, which form the ink chambers 32, in which ink is stored until a resistor 34 is heated to eject the ink from the chamber 32. The cut-outs 108 are longitudinally aligned in sets having the same spacing as the resistors 34. Partitions 110 are left between the chambers 32 to segregate the ink in adjacent chambers 32. The ink chambers 32 are fluidically connected with ink channels (not shown), through which ink is delivered from an ink supply (not shown) to the ink chambers.

Figure 14:
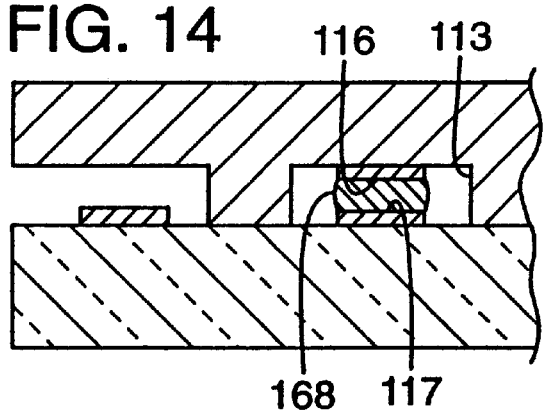
FIG. 14 is a sectional view of the architecture plate, taken along line 14—14 of FIG. 2.

The illustrated plate 104 also has rectangularly shaped solder wells 112 to provide an area in which to attach the plate 104 to the substrate 36, as will be explained in greater detail below. The solder wells 112 (one of which is shown in FIG. 10) are positioned at the ends 105 of the plate 104, and several additional solder wells 113 are positioned laterally adjacent the chambers 32 toward the interconnect area 24. One well 113 is shown in FIG. 14.

The architecture plate 104 is preferably made from a material with a coefficient of thermal expansion similar to that of the substrate 36. Etched or molded glass or amorphous silicon are particularly suitable. Ceramic is also a possibility. Amorphous silicon is preferable if the substrate is also made of amorphous silicon. A glass plate on a glass substrate would also work well. Similar coefficients of thermal expansion will help the plate and substrate maintain alignment over a wide range of temperatures, will not stress the joints unreasonably, and will not tend to warp the assembly. Silicon is especially desirable because it will be somewhat flexible and therefore more resistant to handling damage than a comparable glass part.

The architecture plate 104 is attached to the substrate 36 using the soldering technique described above, which has the added advantage of aligning the architecture plate 104 with the substrate 36. Specifically, the technique comprises: depositing solderable pads 116, 117 on the bottom surface 118 of each of the solder wells 112 in the architecture plate 104 and on the circuit traces 40 on the substrate 36 at corresponding locations; depositing solder paste around each of the solderable pads 117 on the circuit trace layer 40; heating the solder paste to form a solder ball 166 (shown in dashed lines, FIG. 10) on each of the solderable pads 117 on the circuit trace layer 40; positioning the plate 104 adjacent the substrate 36 so that the solderable pads 116 on the plate 104 are aligned with the solder balls 166 on the substrate 36; and heating the solderable pads 116 on the plate 104 and the solder balls 166 on the substrate 36 to join (as shown at 168) the plate 104 and substrate 36. The heating is preferably done while at least one of the substrate 36 and plate 104 are unconstrained so that the plate 104 and substrate 36 may self-align. The solder balls 166 should be of a sufficient size to ensure that the plate 104 does not drag on the substrate 36 and prevent alignment. It should be understood that the solder balls 166 could be formed on the solderable pads 116 on the plate 104 instead of the substrate 36.

After joining the plate 104 and substrate 36, preferably heat and pressure are applied to the plate 104 and substrate 36 to close any gaps that may exist between the chambers 32 in the plate 104 so that no crosstalk occurs through this path.

It should be evident that the illustrated solder joints formed within the solder wells 112, 113 only serve to mechanically align the architecture plate 104 and the substrate 36; no electrical connections are made.

This invention would also be suitable for other configurations of architecture plates. FIG. 11 shows an alternative edge-firing architecture plate 180 in which the architecture plate 180 is a solid, dielectric block 181 (without cut-outs) and the ink chambers 182 are defined by depositing, preferably by spinning on, a dielectric layer 184, such as polyimide, over the resistors 34. The openings for the chambers 182 are created by photoimaging, chemical etching, laser drilling, or the like.

FIG. 12 shows an alternative edge-firing architecture plate 200 having chambers 232 cut into the bottom surface 233 of the architecture plate 200. Unlike the previously mentioned edge-firing plate 104, the chambers 232 in the alternatively configured plate 200 do not extend all the way to the longitudinal edge 206 of the plate. Rather, the alternatively configured plate has a nozzle 238 extending from approximately the center of an interior wall (not shown) nearest the edge 200 of each chamber 232 to the longitudinal edge 206 of the plate 200. For optimal ink flow and directional stability of the ejected ink, the nozzle 238 should taper from the interior wall of the chamber 232 to the edge 206 of the plate.

FIG. 13 shows yet another alternative architecture plate, designated a face-firing plate 300. The face-firing plate 300 has frustrum-shaped ink chambers 332 extending from the bottom surface 333 of the plate 300 approximately two-thirds of the way through the plate 300. The chambers 332 are aligned longitudinally along the plate 300 and are spaced in sets to correspond with the spacing of the sets of resistors 34 on the substrate 36. Frustum-shaped nozzles 342 extend from the chambers 332 to the top surface 343 of the plate 300. Ink is fired by the resistors 34 from the chambers 332, through the nozzles 342, and onto paper being fed along the top surface 343 of the architecture plate 300.

Alternatively, ink chambers for the alternative plates 200, 300 could be defined using a dielectric layer, as described in conjunction with plate 180.

Figure 15:
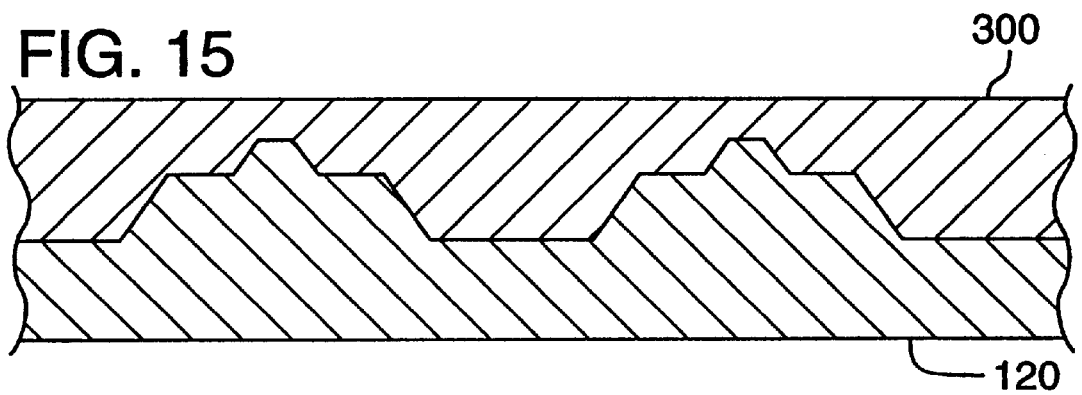
FIG. 15 is a partial side view of the face-firing architecture plate of FIG. 13 being cast on a mandrel.
Figure 16:
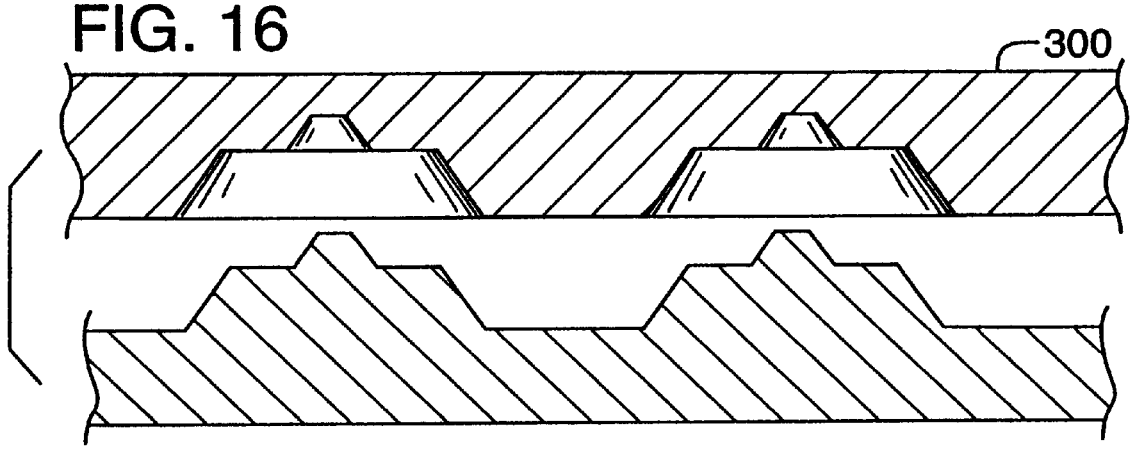
FIG. 16 is a partial side view of the architecture plate detaching from the mandrel of FIG. 13.
Figure 17:
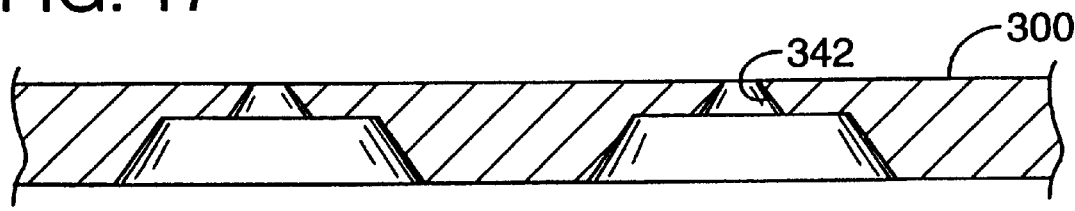
FIG. 17 is a partial side view of the architecture plate of FIG. 13 after chem-lapping.

FIG. 15 illustrates the fabrication of the face-firing architecture plate 300 on a mandrel 120. Any of the illustrated architecture plates 104, 200, 300 may be fabricated using a mandrel. The mandrel 120 has the negative of the features of the desired architecture plate and is preferably made of alumina or another material having a higher enthalpy of formation than the material of the architecture plate (silicon dioxide, for instance), so the mandrel is not affected chemically during fabrication, and a higher coefficient of thermal expansion than the material of the architecture plate. Thus, as long as the mandrel 120 is designed with the proper draft angles, the plate 300 will "pop off" the mandrel during cooling, as indicated in FIG. 16. The architecture plate is then "chem-lapped" to the desired flatness and thickness and to create the nozzles 342, as shown in FIG. 17. Chem-lapping involves subjecting the plate to chemical mechanical planarization, in which the plate is abraded by a combination of mechanical disturbance and etching chemicals.

An encapsulant (not shown), such as polyimide, could be applied to the periphery of the joint (not shown) between the plates 104, 200, 300 and the substrate 36 to prevent ink leakage therefrom.

The solder balls for attaching any of the architecture plates 104, 200, 300 to the substrate 36 could be formed at the same time the solder balls 68 for attaching the driver chip 26 to the substrate 36 are formed.

This description illustrates various embodiments of the present invention and should not be construed to limit the scope thereof in any way. Other modifications and variations may be made to the method and assembly described without departing from the invention as defined by the appended claims and their equivalents.

What is claimed is:

1. A microelectronic subassembly comprising:
    a first part;
    at least one first part solder pad attached to the first part;
    a solder ball attached to the first part solder pad;
    a mating part having a mating part solder pad attached thereon, the mating part solder pad being in contact with but not soldered to the solder ball; and
    a unitary underfill layer attached to the first part and adjacent to the mating part prior to soldering the first and mating part together, the underfill layer having an opening so that the underfill layer surrounds the solder ball, the underfill layer being located to contact and bond together the first part and mating part in the absence of material layers other than the unitary underfill layer upon application of heat and pressure thereto.

2. The subassembly of claim 1 in which the solder ball was formed using a solder paste, and by sizing the opening in the underfill layer to receive an appropriate amount of solder paste for forming a solder ball in reflow, and by using the opening in the underfill layer as a stencil to deposit an appropriate amount of solder paste in the underfill layer opening.

3. The subassembly of claim 1 in which one of the first part and the mating part is a substrate that carries a die of integrated circuits.

4. The subassembly of claim 1 in which one of the first part and the mating part is a flexible circuit.

5. The subassembly of claim 1 in which the underfill layer is made from a polymer, thereby providing polymeric bonding attachment of the underfill layer to both the first and mating parts upon application of heat and pressure to the subassembly.

6. The subassembly of claim 1 further comprising an ink-jet pen to which is mounted the subassembly of claim 1 and in which one of the first part and the mating part is a plate having a chamber through which ink can be ejected.

7. The subassembly of claim 6 in which the chamber is configured to accommodate a resistor having an upper surface and edges such that one of the edges of the resistor faces a direction in which ink is ejected from the chamber.

8. The subassembly of claim 6 in which the opening in the underfill layer defines the chamber.

9. The subassembly of claim 1 in which the first part and the mating part are unconstrained during assembly so that the parts self-align with one another.

10. A thermal ink-jet print head comprising:
    a substrate;
    resistors mounted on the substrate;
    conductive traces carried on the substrate and extending from the resistors and terminating in interconnect pads on the substrate;
    a chip bonded to the substrate and having solder pads carried thereon, each solder pad being soldered to an interconnect pad to define a metallic connection therebetween; and
    a plurality of chambers defined in the bonded substrate and chip for holding ink and arranged so that substantially each one of the chambers encloses one of the resistors and wherein certain of the substrate chambers do not enclose one of the resistors, those certain chambers containing solder means for soldering together the chip and the substrate.

11. The print head of claim 10 wherein the substrate and chip have substantially similar coefficients of thermal expansion.

12. The print head of claim 10 wherein the chip and substrate are made of silicon.

13. The print head of claim 10 wherein the chambers containing solder means for soldering together the chip and the substrate are free of connections for transferring electrical signals through those soldered chambers.

* * * * *

UNITED STATES PATENT AND TRADEMARK OFFICE
CERTIFICATE OF CORRECTION

PATENT NO. : 6,113,216
DATED : September 5, 2000
INVENTOR(S) : Marvin G. Wong

It is certified that error appears in the above-identified patent and that said Letters Patent is hereby corrected as shown below:

<u>Title page,</u>
Item [56], References Cited, U.S. PATENT DOCUMENTS, add the following:
-- 5,323,084 06/1994 Haitz................. 313/500;
5,070,410 12/1991 Hadley.................. 358/296 --.

Signed and Sealed this

Twenty-fifth Day of March, 2003

JAMES E. ROGAN
*Director of the United States Patent and Trademark Office*